United States Patent [19]

Luning et al.

[11] Patent Number: 6,153,487
[45] Date of Patent: Nov. 28, 2000

[54] APPROACH FOR THE FORMATION OF SEMICONDUCTOR DEVICES WHICH REDUCES BAND-TO-BAND TUNNELING CURRENT AND SHORT-CHANNEL EFFECTS

[75] Inventors: Scott D. Luning, San Francisco; Timothy J. Thurgate, Sunnyvale; Daniel Sobek, Portola Valley; Nicholas H. Tripsas, San Jose, all of Calif.

[73] Assignee: Advanced Micro Devices, Inc., Sunnyvale, Calif.

[21] Appl. No.: 09/040,107

[22] Filed: Mar. 17, 1998

[51] Int. Cl.[7] .......................... H01L 21/22; H01L 21/38; H01L 21/336; H01L 29/76
[52] U.S. Cl. .......................... 438/307; 438/549; 438/306; 257/336; 257/337; 257/335
[58] Field of Search .................................. 438/307, 549, 438/306; 257/337, 336, 335

[56] References Cited

U.S. PATENT DOCUMENTS

| | | | |
|---|---|---|---|
| 5,371,394 | 12/1994 | Ma et al. .............................. | 257/335 |
| 5,719,424 | 2/1998 | Ahmad et al. ......................... | 257/336 |
| 5,897,348 | 4/1999 | Wu ....................................... | 438/200 |

*Primary Examiner*—Carl Whitehead, Jr.
*Assistant Examiner*—James Park
*Attorney, Agent, or Firm*—Sawyer Law Group LLP

[57] ABSTRACT

The present invention provides a method and system for the formation of semiconductor devices which reduces band-to-band tunneling current and short-channel effects. The method and system includes implanting first low-dose arsenic into an area in the substrate, thermally diffusing the first low-dose arsenic through a portion of the substrate, implanting a second higher-dose arsenic into the area in the substrate, and diffusing the second higher-dose arsenic into the area in the substrate. Under the present invention, the combination of the first and second arsenic implants has a graded lateral profile which reduces band-to-band tunneling current and short-channel effects. The method also improves the reliability and performance of the semiconductor devices.

6 Claims, 7 Drawing Sheets

Substrate 100

Boron Implantation

Substrate 100

Oxide Layer 120

P-Type Substrate 100

APPROACH FOR THE FORMATION OF SEMICONDUCTOR DEVICES WHICH REDUCES BAND-TO-BAND TUNNELING CURRENT AND SHORT-CHANNEL EFFECTS

FIELD OF THE INVENTION

The present invention relates to semiconductor processing and more particularly to a method and system for forming laterally graded arsenic-only junctions in FLASH memory devices.

BACKGROUND OF THE INVENTION

FLASH memory devices are utilized for a variety of applications. FIGS. 1A–1F illustrate a first conventional process for forming a portion of a FLASH memory device. First, a substrate 100 is formed, as illustrated in FIG. 1A. Then the substrate 100 is lightly doped, typically with Boron, to form a p-type substrate, as illustrated in FIG. 1B. A layer of field oxide 120 is grown on the surface of the substrate 100, as illustrated in FIG. 1C. The field oxide 120 is further processed using known methods and results in the oxide layer 140, as illustrated in FIG. 1D. The gate 130 is then defined also using known methods, as illustrated in FIG. 1D.

Under this first conventional method, as illustrated in FIG. 1E, the source junction structure is formed by a high-dose implantation of arsenic into the substrate 100. The resulting source junction structure is shown in FIG. 1F.

A common problem in the above structure is the existence of band-to-band tunneling current. It is well known that steep doping gradient as found in a single-implant, arsenic-only source profile (see FIG. 2) of a FLASH memory device can cause high and deleterious levels of band-to-band tunneling current during the erase operation and that the introduction of some phosphorus at the junction and near the surface of the substrate under the gate can alleviate this problem. Dotted line 150 on FIG. 1F indicates the line along which the doping profile of FIG. 2 is represented. The portion of the source doping profile under the gate 130 provides for efficient erasing of the FLASH memory device.

FIGS. 3A–3D illustrate a second conventional process which introduces phosphorus into the substrate. Typically, the phosphorus is introduced after the doping of the substrate 300, the growing of the oxide layer 320, and the definition of the gate 330, as described with respect to the first conventional process, as described in FIG. 1A–1F. As illustrated in FIG. 3A, the phosphorus is usually introduced by implanting it into the substrate 300. A high-dose of arsenic is then implanted, as illustrated by FIG. 3B. Then the phosphorus and arsenic laterally diffuse to their location at the junction area of the substrate 300, as illustrated by dotted circle 340 in FIG. 3C. This subsequent diffusion of the high-dose arsenic results in the final source structure.

The resulting arsenic-phosphorus source junction structure is illustrated in FIG. 3D. Since the phosphorus diffuses further into the substrate than the arsenic and because of the general characteristics of phosphorus diffusion profiles, it has a more graded lateral concentration profile, i.e., the slope of the profile is less steep. This combination profile, shown in FIG. 4, does reduce band-to-band tunneling current, but it creates another problem, that of the so-called short channel effect. The short-channel effect is due to the phosphorus creeping into other regions of the substrate, due to the depth of the initial implant and the diffusion of the phosphorus in all directions, as illustrated by arrows 360 in FIGS. 3C–3D. Dotted line 370 on FIG. 3D indicates the line along which the doping profile of FIG. 4 is represented. Referring back to FIG. 4, line 400 represents the substrate/channel doping level. Where the line 400 intersects the phosphorus lateral concentration profile marks the doping concentration level of the source junction. The phosphorus represented by its lateral concentration profile above line 400 reduces the band-to-band tunneling current. However, the phosphorus has a "tail," represented by its concentration profile below the line 400. The tail of the phosphorus, also represented by arrows 360 of FIG. 3C–3D, has crept deeply into the substrate 300 beyond the source junction and into the doped channel beyond the source junction, thereby increasing deleterious short-channel effects.

There thus exists a need for a new method for forming a source junction structure in semiconductor devices which reduces band-to-band tunneling while also reducing short-channel effects. The method should be easily implemented utilizing existing technologies while also being cost effective. The present invention addresses such a need.

SUMMARY OF THE INVENTION

The present invention provides a method and system for the formation of semiconductor devices which reduces band-to-band tunneling current and short-channel effects. The method and system includes implanting a first low-dose arsenic into an area in the substrate, thermally diffusing the first low-dose arsenic through a portion of the substrate, implanting a second higher-dose arsenic into the area in the substrate, and diffusing the second higher-dose arsenic into the area in the substrate. Under the present invention, the combination of the first and second arsenic implants has a graded lateral concentration profile which reduces band-to-band tunneling current and short-channel effects. The method also improves the reliability and performance of the semiconductor device.

DETAILED DESCRIPTION OF THE INVENTION

The present invention relates to semiconductor processing and more particularly to a method and system for forming semiconductor devices which reduces band-to-band tunneling current and short-channel effects. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 5A:
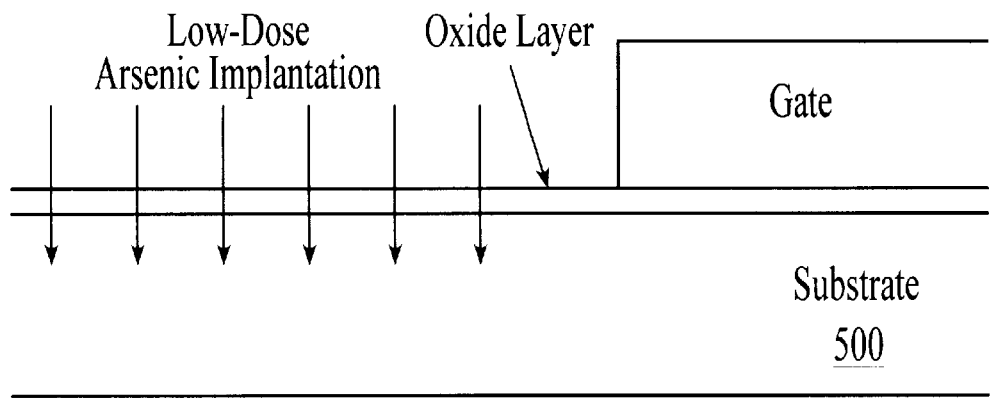
FIG. 5A is an illustration of a low-dose implant of arsenic into the substrate of a FLASH memory device in accordance with the present invention.
Figure 5B:
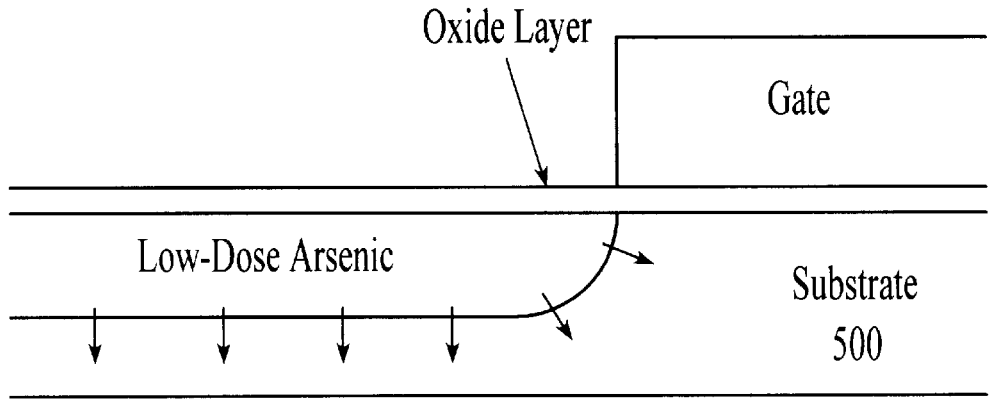
FIG. 5B is an illustration of the thermal diffusion of the low-dose arsenic through the substrate in a FLASH memory device in accordance with the present invention.
Figure 5C:
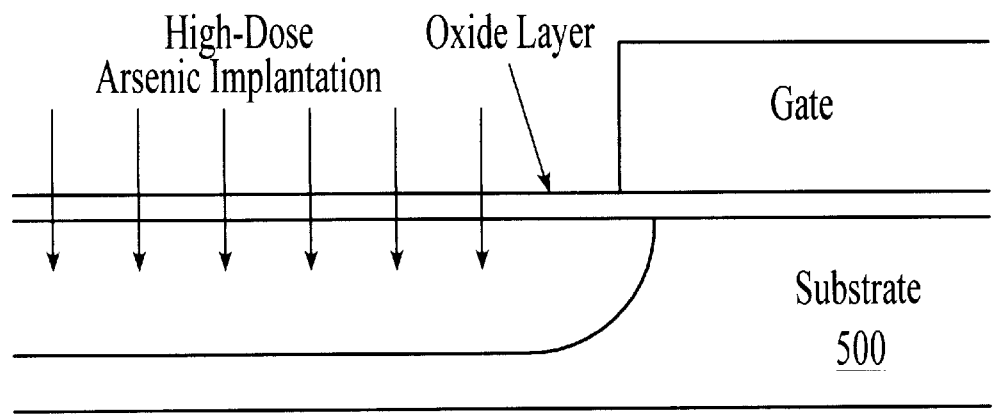
FIG. 5C is an illustration of a higher-dose implant of arsenic into the substrate in accordance with the present invention.
Figure 6A:
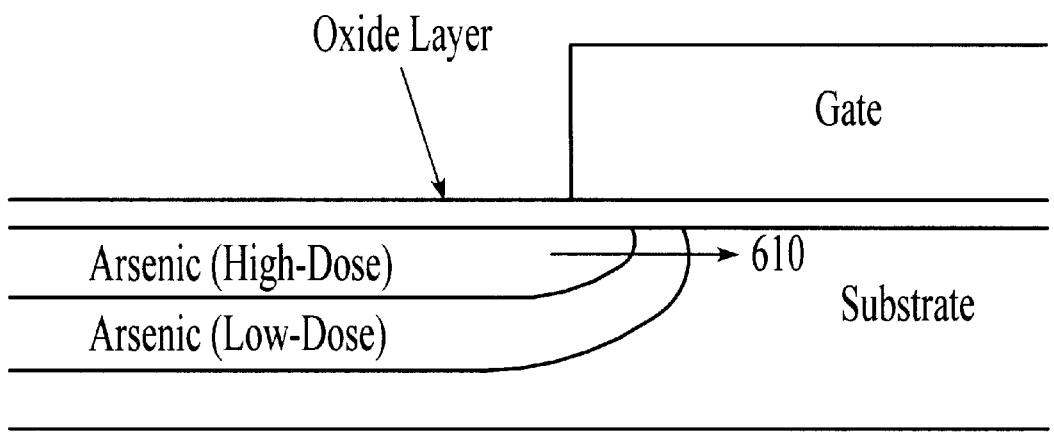
FIG. 6A is an illustration of a FLASH memory device with an arsenic-arsenic source junction structure formed in accordance with the present invention.
Figure 6B:
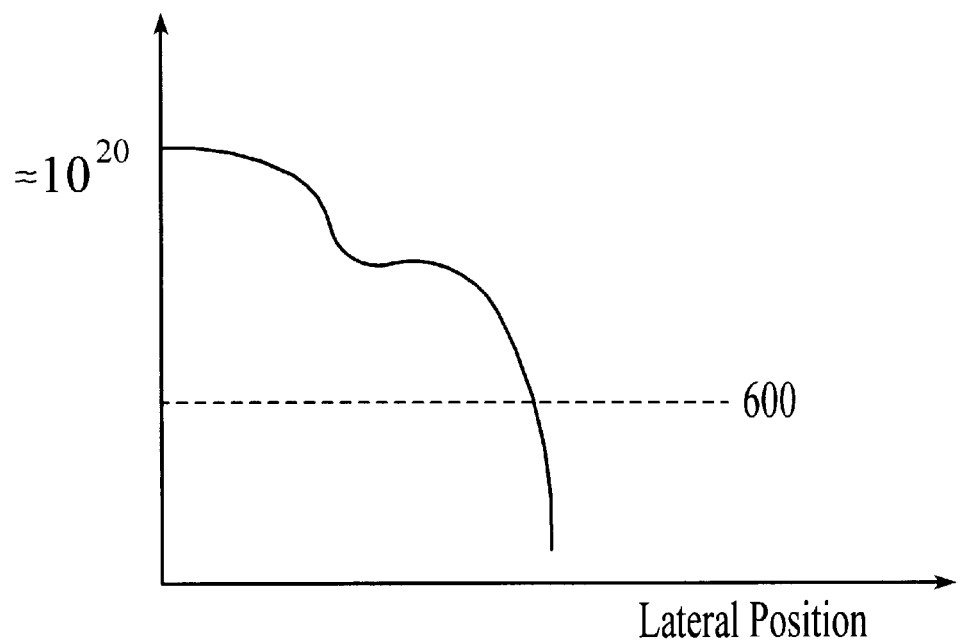
FIG. 6B is a graph of the lateral concentration profile of an arsenic-arsenic source junction structure formed in accordance with the present invention.

FIGS. 5A–5C illustrate the method and system of forming a FLASH memory device source junction structure in accordance with the present invention. First, a low-dose of arsenic of $10^{13}/cm^2$ to $5\times10^{14}/cm^2$ is implanted into the substrate 500, as illustrated by FIG. 5A. The arsenic is then thermally diffused to form a preliminary junction structure using known methods, as illustrated by FIG. 5B. Then a higher-dose of arsenic greater or equal to $10^{15}/cm^2$ is implanted into the same area in the substrate 500, as illustrated by FIG. 5C. This second implant is also diffused. Once the second implant is performed and diffused, the source junction is created in its final form. The standard process may then continue. The structure resulting from the approach of the present invention is illustrated in FIG. 6A. It has the lateral concentration profile of FIG. 6B. Dotted line 610 of FIG. 6A indicates the line along which the doping profile of FIG. 6B is represented.

Figures 1A, 1B, 1C:
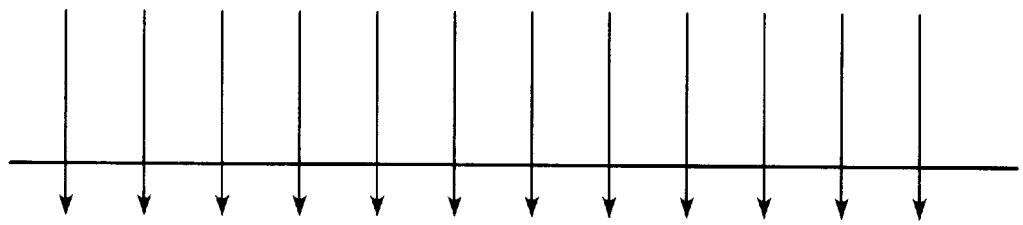
FIG. 1A is an illustration of the forming of a substrate of a FLASH memory device under a first conventional process.
FIG. 1B is an illustration of the light doping of the substrate of a FLASH memory device under a first conventional method.
FIG. 1C is an illustration of the growing of an oxide layer on the surface of the substrate of a FLASH memory device under a first conventional process.
Figure 1D:
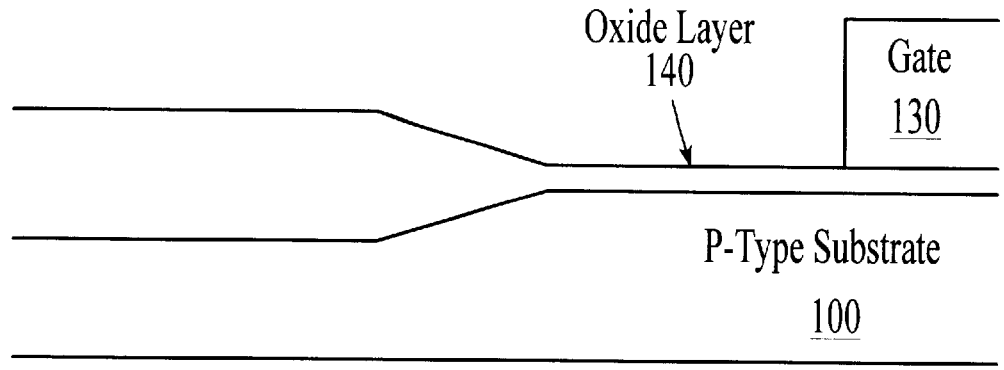
FIG. 1D is an illustration of the definition of a gate of a FLASH memory device under a first conventional method.
Figure 1E:
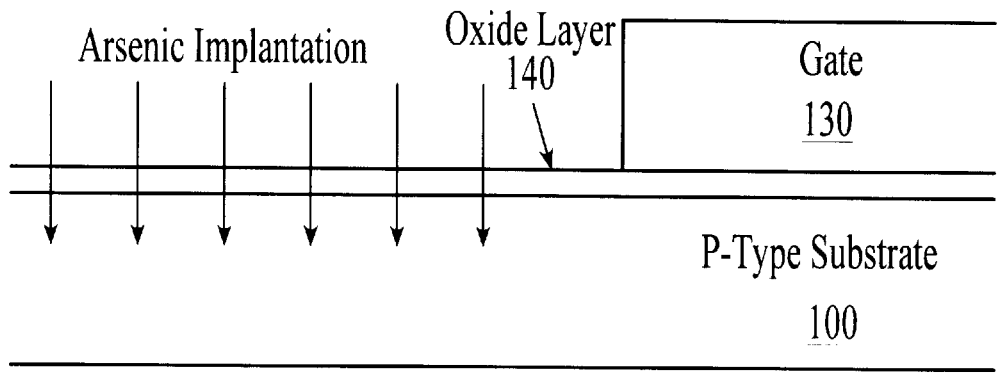
FIG. 1E is an illustration of the implantation of arsenic into the substrate of a FLASH memory device under a first conventional method.
Figure 1F:
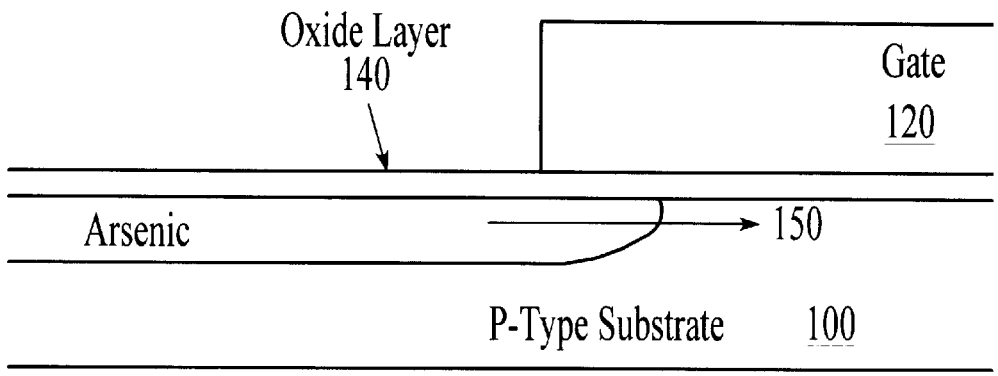
FIG. 1F is an illustration of a single-implant, arsenic-only source junction structure formed under a first conventional process.
Figure 2:
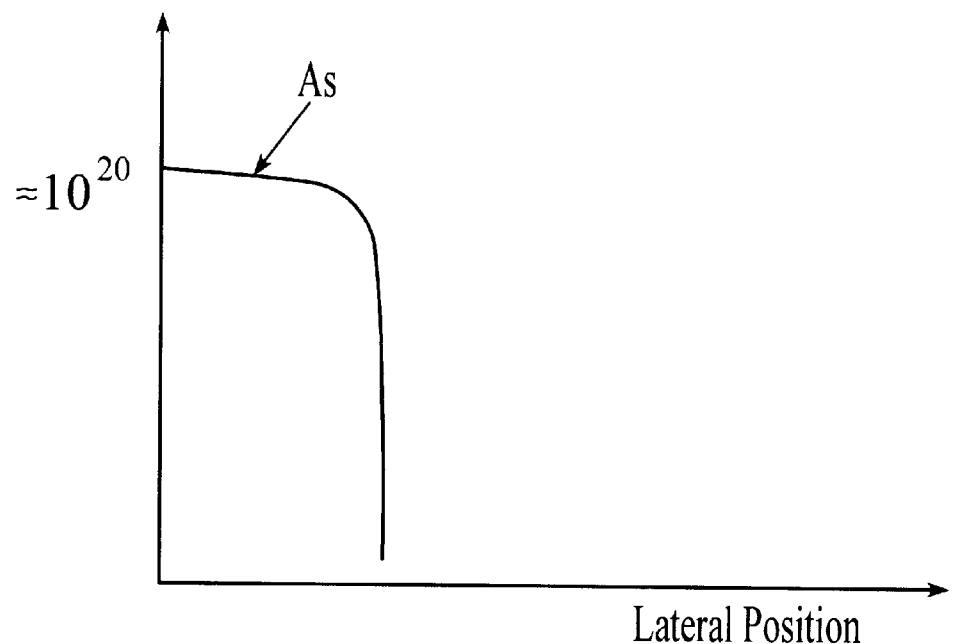
FIG. 2 is a graph of the lateral concentration profile of an arsenic-only source junction structure formed under a first conventional method.
Figure 3A:
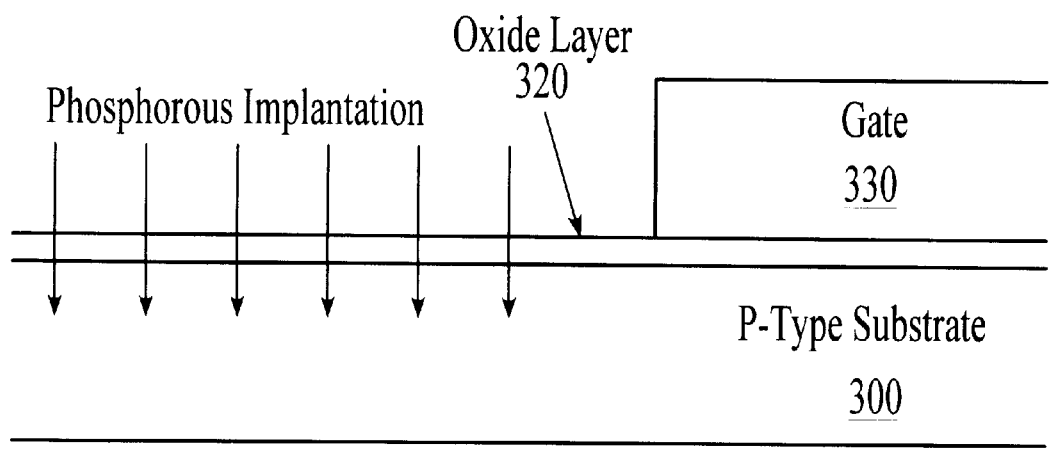
FIG. 3A is an illustration of the implantation of phosphorus into the substrate of a FLASH memory device under a second conventional method.
Figure 3B:
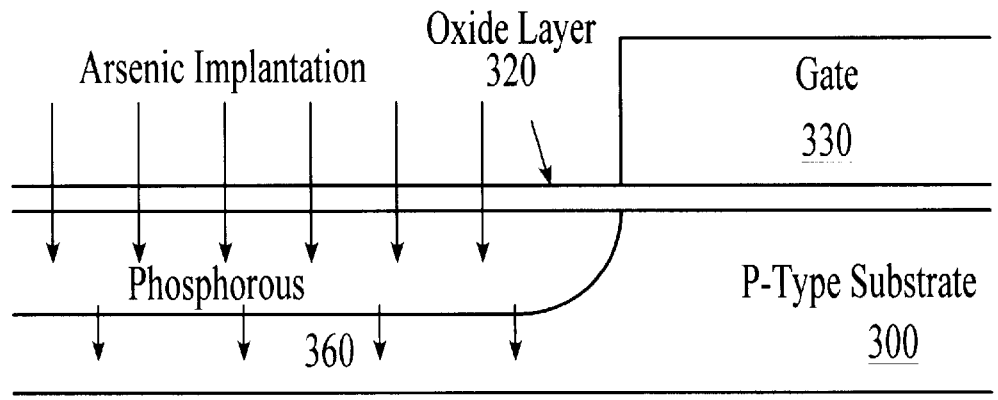
FIG. 3B is an illustration of the implantation of arsenic into the substrate in a FLASH memory device under a second conventional method.
Figure 3C:
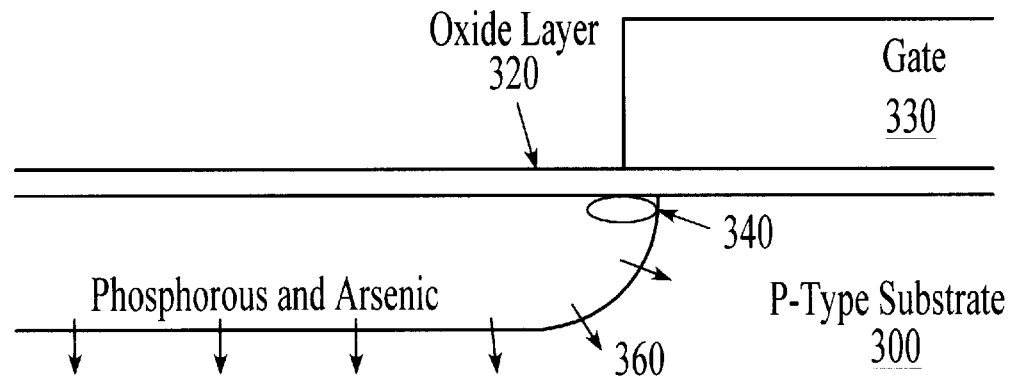
FIG. 3C is an illustration of the diffusion of phosphorus and arsenic to their location in the substrate in a FLASH memory device under a current method.
Figure 3D:
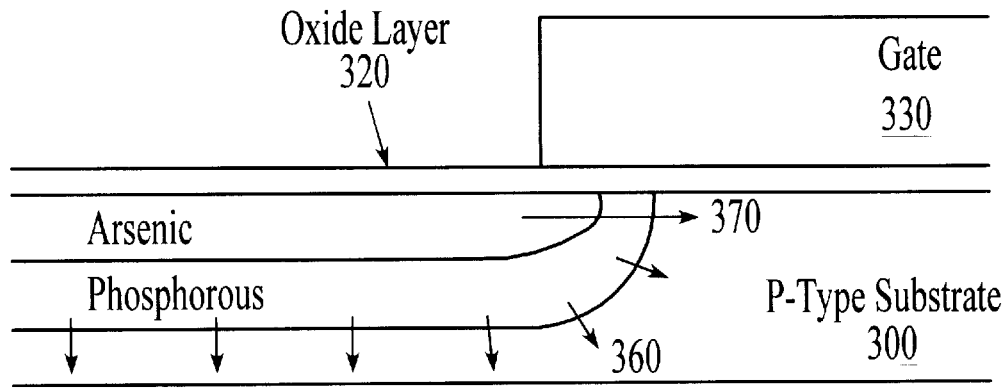
FIG. 3D is an illustration of a combined arsenic-phosphorus source junction structure formed under a second conventional process.
Figure 4:
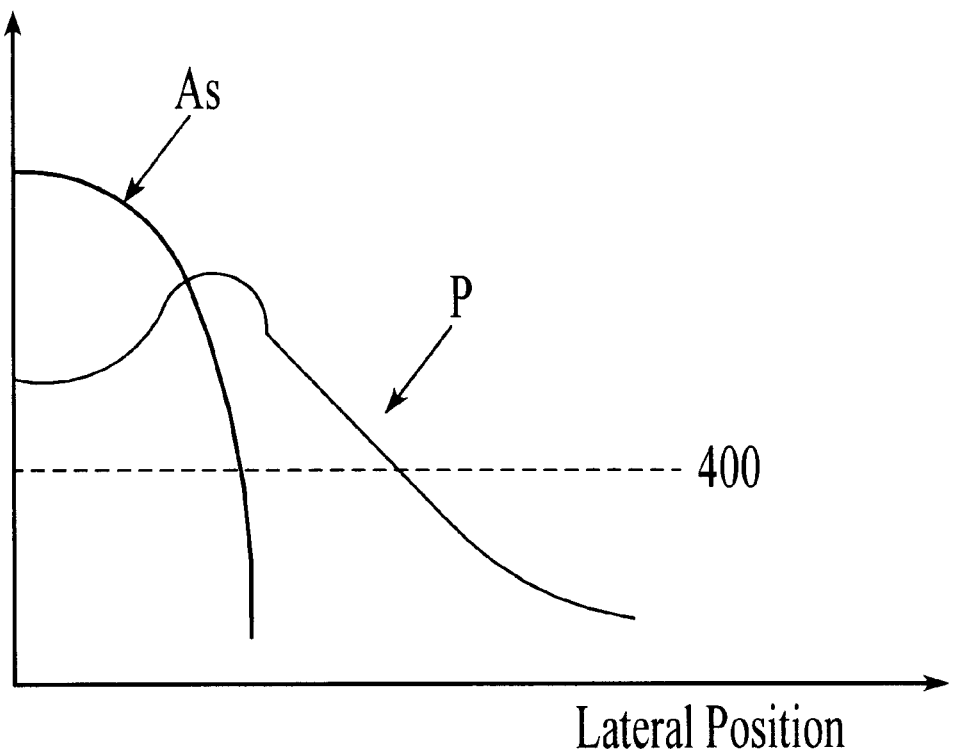
FIG. 4 is a graph of the lateral concentration profile of a combined arsenic-phosphorus source junction under a second conventional process.

Under the present invention, phosphorus is not implanted since the graded lateral concentration profile is accomplished through the first (low-dose) arsenic implant. This thermally diffused arsenic forms a graded profile, so that band-to-band tunneling current is reduced. Unlike the phosphorus, the low-dose arsenic implant proposed in this invention does not produce a long tail. Where line 600 of FIG. 6B, representing the channel doping level, intersects the lateral concentration profile marks the doping concentration level of the source junction. The tail portion of its profile is steeper than that for a phosphorus implant (see FIG. 4). Therefore, the approach in accordance with the present invention reduces low band-to-band tunneling currents while, at the same time, reducing short-channel effects. A device formed in accordance with the present invention improves the reliability and performance of FLASH memory devices.

Although the present invention has been described with a low-dose of arsenic of $10^{13}/cm^2$ to $5\times10^{14}/cm^2$, and a high-dose of arsenic of $10^{15}/cm^2$, one of ordinary skill in the art will understand that other levels of arsenic may be used without departing from the spirit and scope of the present invention. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for forming a source junction structure in a semiconductor device, the semiconductor including a substrate, consisting the steps of:

a) implanting a first low-dose arsenic into an area in the substrate;

b) causing the first low-dose arsenic to diffuse through a portion of the substrate;

c) implanting a second higher-dose arsenic into the area in the substrate; and causing the second higher-dose arsenic to diffuse through a portion of the substrate.

2. The method in claim 1, wherein the first low-dose arsenic is thermally diffused to form a graded lateral concentration profile.

3. The method in claim 1, wherein the combination of the first low-dose arsenic implant and the second higher-dose arsenic implant provides a lateral concentration profile which reduces short-channel effect.

4. The method in claim 1, wherein the first low-dose arsenic is $10^{13}/cm^2$ to $5\times10^{14}/cm^2$.

5. The method in claim 1, wherein the second higher-dose arsenic is greater or equal to $10^{15}/cm^2$.

6. A method for forming a source junction structure in a semiconductor device, the semiconductor including a substrate, consisting the steps of:

a) implanting a first low-dose arsenic into an area in the substrate;

b) causing the first low-dose arsenic to diffuse through a portion of the substrate; and c) implanting a second higher-dose arsenic into the area in the substrate, such that the combination of the first and second arsenic implants has a graded lateral concentration profile; and d) causing the second higher-dose arsenic to diffuse through a portion of the substrate.

* * * * *